(12) United States Patent
Wurtz et al.

(10) Patent No.: US 10,856,064 B2
(45) Date of Patent: *Dec. 1, 2020

(54) OPERATION OF A PERSONAL AUDIO DEVICE DURING INSERTION DETECTION

(71) Applicant: AVNERA CORPORATION, Beaverton, OR (US)

(72) Inventors: Michael Jon Wurtz, Lake Oswego, OR (US); Amit Kumar, Portland, OR (US); Jiajin An, Beaverton, OR (US)

(73) Assignee: AVNERA CORPORATION, Hillsboro, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 16/397,953

(22) Filed: Apr. 29, 2019

(65) Prior Publication Data
US 2019/0335266 A1 Oct. 31, 2019

Related U.S. Application Data

(60) Provisional application No. 62/663,521, filed on Apr. 27, 2018.

(51) Int. Cl.
H04R 29/00 (2006.01)
H04R 3/00 (2006.01)
(Continued)

(52) U.S. Cl.
CPC ..... *H04R 1/1041* (2013.01); *G10K 11/17855* (2018.01); *H03F 13/00* (2013.01);
(Continued)

(58) Field of Classification Search
CPC ...... H04R 1/10; H04R 1/1016; H04R 1/1041; H04R 1/083; H04R 1/1008; H04R 1/1083; H04R 25/305; H04R 25/453; H04R 5/003; H04R 3/04; H04R 460/01; H04R 460/03; H04R 460/05; H04R 460/15;
(Continued)

(56) References Cited

U.S. PATENT DOCUMENTS 9,516,442 B1 * 12/2016 Dusan ................. H04R 29/001
2004/0196992 A1 * 10/2004 Ryan ........................ H04R 1/10
381/312
(Continued)

FOREIGN PATENT DOCUMENTS

KR 20080035079 A * 4/2008

*Primary Examiner* — Thang V Tran
(74) *Attorney, Agent, or Firm* — Lando & Anastasi, LLP

(57) ABSTRACT

A method of operating a personal audio device configured to be removed from and inserted into a user's ear can include generating an input signal by an input signal generating device. The method can also include determining whether an insertion event has occurred based on the generated input signal and causing the personal audio device to operate in a low power mode responsive to an absence of an insertion event determination after a first period of time. The method can also include causing the personal audio device to operate in an ultra-low power mode responsive to the absence of an insertion event determination after a second period of time that occurs after the first period of time, the ultra-low power mode having a lower power consumption than the low power mode.

18 Claims, 11 Drawing Sheets

(51) Int. Cl.

| | |
|---|---|
| *H04R 1/10* | (2006.01) |
| *H04R 3/04* | (2006.01) |
| *G10K 11/178* | (2006.01) |
| *H03F 13/00* | (2006.01) |
| *H03G 7/00* | (2006.01) |
| *H04R 1/08* | (2006.01) |
| *H03F 3/181* | (2006.01) |
| *H03F 3/60* | (2006.01) |

(52) U.S. Cl.
CPC ............. *H03G 7/002* (2013.01); *H04R 1/083* (2013.01); *H04R 1/1008* (2013.01); *H04R 1/1083* (2013.01); *H04R 3/04* (2013.01); *H04R 29/001* (2013.01); *G10K 2210/1081* (2013.01); *H03F 3/181* (2013.01); *H03F 3/602* (2013.01); *H04R 2201/028* (2013.01); *H04R 2460/01* (2013.01); *H04R 2460/03* (2013.01)

(58) Field of Classification Search
CPC ............. H04R 2201/028; H03G 7/002; G10K 11/17855; G10K 2210/1081; H03F 13/00; H03F 3/181; H03F 3/602
See application file for complete search history.

(56) References Cited

U.S. PATENT DOCUMENTS

| | | | |
|---|---|---|---|
| 2011/0235817 A1* | 9/2011 | Lin ...................... | H04R 1/1041 381/74 |
| 2012/0321103 A1* | 12/2012 | Smailagic ............ | H04R 1/1041 381/98 |
| 2014/0037101 A1* | 2/2014 | Murata .................... | H04R 3/00 381/74 |
| 2015/0304757 A1* | 10/2015 | Kim ...................... | H04R 1/1041 381/74 |
| 2018/0014103 A1* | 1/2018 | Martin ................. | H04R 1/1025 |
| 2018/0039086 A1* | 2/2018 | Jiang ................. | G02B 27/0101 |
| 2019/0052951 A1* | 2/2019 | Kofman ............... | H04R 1/1016 |
| 2019/0110121 A1* | 4/2019 | Sapozhnykov ...... | H04R 1/1041 |
| 2019/0215611 A1* | 7/2019 | Lou ........................ | G06F 3/011 |
| 2019/0335263 A1* | 10/2019 | Wurtz ................. | H04R 1/1008 |
| 2019/0335266 A1 | 10/2019 | Wurtz et al. | |
| 2019/0335267 A1* | 10/2019 | Wurtz .................... | H03G 7/002 |

* cited by examiner

OPERATION OF A PERSONAL AUDIO DEVICE DURING INSERTION DETECTION

CROSS-REFERENCE TO RELATED APPLICATION

This application claims the benefit of U.S. Provisional Patent Application No. 62/663,521, filed Apr. 27, 2018 and entitled "Headphone Insertion Detection," the disclosure of which is incorporated herein by reference in its entirety.

TECHNICAL FIELD

Embodiments of the invention are directed to methods and apparatuses for determining when a personal audio device has been inserted or re-inserted in or around an ear of the user and operating the headphone during the determining.

BACKGROUND

Typical Active Noise Cancellation (ANC) headphones are electrically powered systems that require a battery or another power source to operate. A commonly encountered problem with powered headphones is that they continue to drain the battery if the user removed the headphones without turning them off. Methods and apparatus to determine when a user has removed headphones are found in U.S. application Ser. No. 15/792,394, filed Oct. 24, 2017, entitled HEADPHONE OFF-EAR DETECTION, which is assigned to the assignee of the present invention and incorporated by reference herein.

Although it is possible to configure an Off-Ear Detection (OED) system, such as a system according to the above-incorporated application, to also detect when a user replaces their headphones in or around his or her ears (referred to here as insertion detection), there are drawbacks from doing so. One limitation is the amount of power consumed while the headphones are in the off-ear state but are actively attempting to determine when the insertion event occurs, i.e., when a user places them back on-ear. The power consumption is mostly due to having to power and enable microphone and headphone signal paths, which include microphones, preamps, Analog to Digital Converters (ADC), Digital to Analog Converters (DAC), and headphone amps.

Embodiments according to the disclosed technology address these and other limitations.

DETAILED DESCRIPTION

Embodiments of the disclosed technology are generally directed to methods and apparatuses for operating one or more personal audio devices, such as headphones or earbuds, for example, in multiple power modes while detecting when a user puts the device(s) in or around his or her ears, referred to herein as an insertion event, by evaluating an insertion signal generated when the user physically places the device(s) in or around either or both of his or her ears.

The personal audio device insertion signal as described herein is typically a very strong, low-frequency acoustic wave. Embodiments of the disclosed technology are generally able to detect this insertion signal as well as differentiate the signal from other various signals. Due to the particular techniques used as described herein, the insertion signal may be detected using very low amounts of power.

Figure 1:
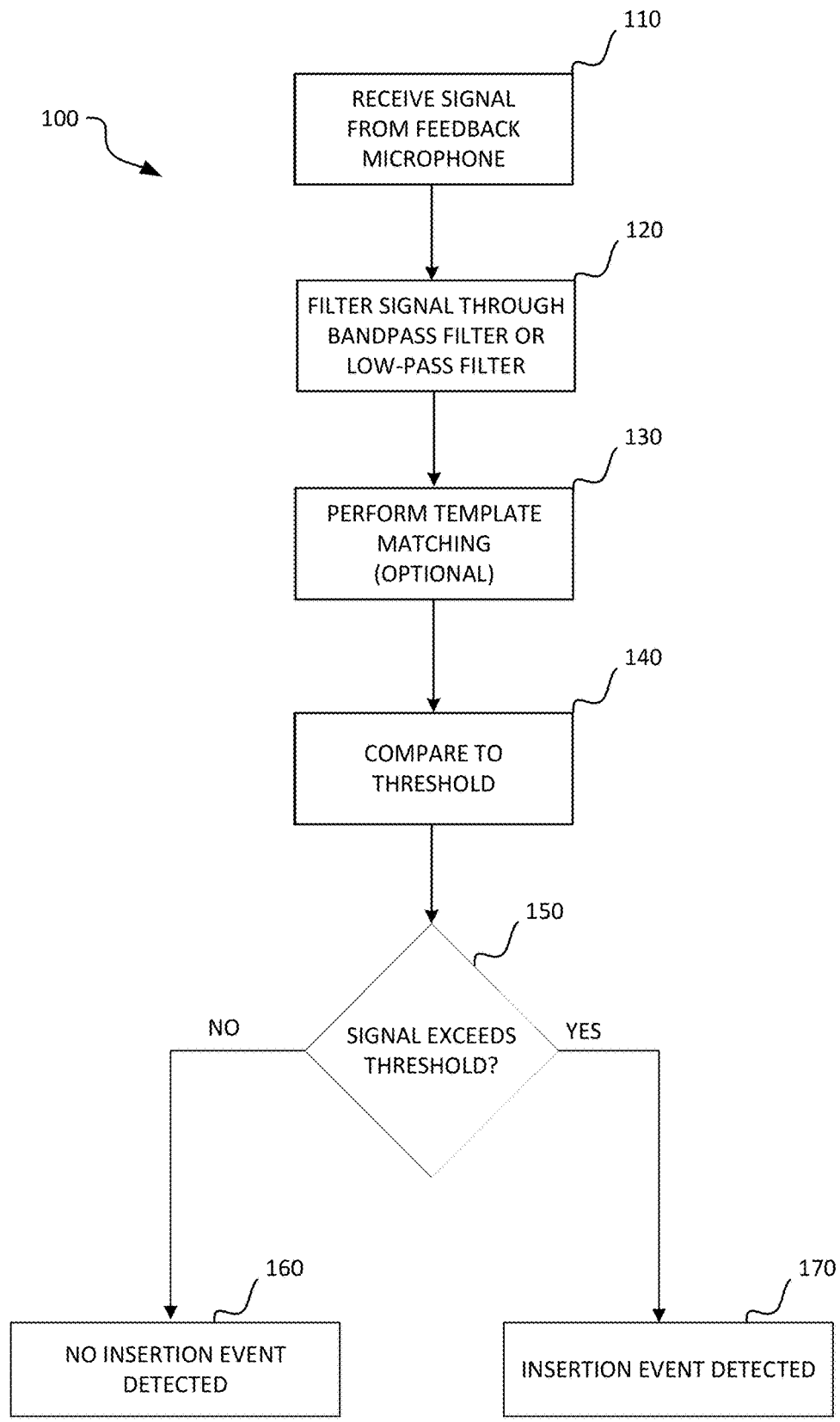
FIG. 1 is a flow diagram illustrating a first example of operations for detecting a headphone insertion event in accordance with certain implementations of the disclosed technology.

FIG. 1 is a flow diagram illustrating a first example 100 of operations for detecting a personal audio device insertion event in accordance with certain implementations of the disclosed technology. In the example 100, the flow illustrates operations used when performing the insertion detection on a feedback signal from a feedback microphone.

ANC headphones typically include a transducer, such as a speaker or speaker driver, for producing sound, a feedback microphone for sampling sounds within the ear or ear cup, and a feedforward microphone for sampling sounds outside the ear or ear cup. Embodiments of the disclosed technology generally include monitoring a signal generated by either or both the transducer and the feedback microphone to determine whether an insertion event occurred. FIG. 1 illustrates operations used by the system when evaluating a signal generated by the feedback microphone.

In the example 100, a signal is received from the feedback microphone in a first operation 110. Although a signal from the feedforward microphone could also be monitored, monitoring the feedback microphone is often preferred because such monitoring generally produces a stronger signal when the headphone is inserted in or on the ear of the user than does the feedforward microphone.

The signal from the feedback microphone is typically filtered in a second operation 120, by passing the signal from the feedback microphone through a conditioning filter such as a bandpass filter or a low frequency filter, for example. Which conditioning filter is used by a system may be implementation specific.

In certain embodiments, a template matching operation 130 may performed. Such template matching may include determining whether the filtered signal remains above a threshold for a certain period of time. In a comparing operation 140, the filtered signal is compared to a signal level threshold. The threshold in operation 140 may be the same threshold or a different threshold that that used during operation 130.

An operation 150 determines whether the filtered signal has exceeded the threshold used in operation 140. If the determination is that the signal has exceeded the threshold, then the system creates an insertion detection signal as indicated by operation 160. Conversely, if the determination is that the signal did not exceed the threshold, then no insertion detection signal is generated as indicated by operation 170.

The operations illustrated by FIG. 1 may be used by a headphone while the headphone is operating in a low power mode.

If the insertion detection signal is generated, the signal may be used to initiate various events, such as automatically turning on music that was previously paused after an off-ear detection signal was generated. If instead no insertion detection signal is generated, the flow 100 may repeat until such an insertion detection occurs.

Figure 2:
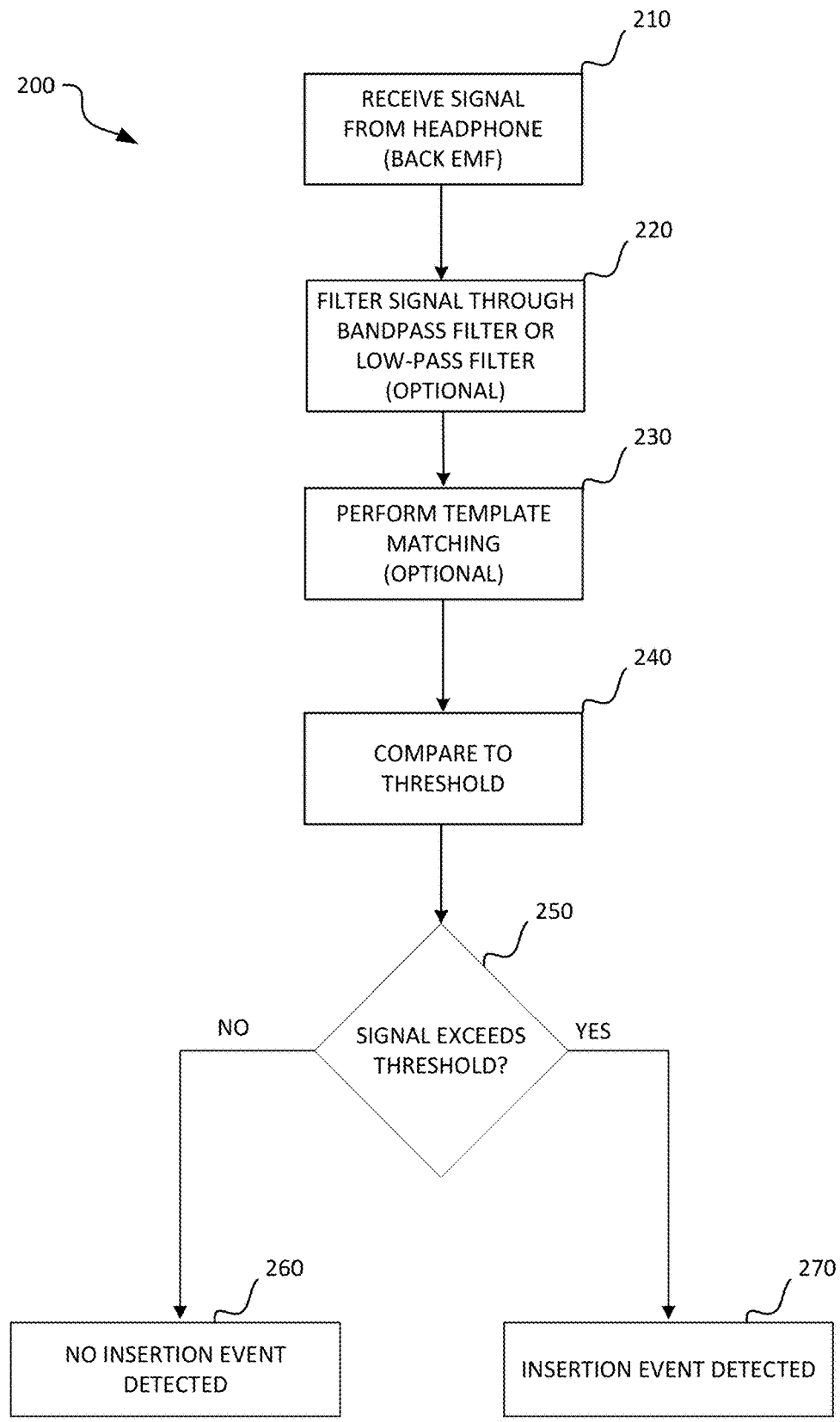
FIG. 2 is a flow diagram illustrating a second example of operations for detecting a headphone insertion event in accordance with certain implementations of the disclosed technology.

FIG. 2 is a flow diagram illustrating a second example 200 of operations for detecting a headphone insertion event in accordance with certain implementations of the disclosed technology. In the example 200, the flow includes operations for monitoring a signal generated by a transducer of the headphone, such as a speaker or speaker driver, which is also referred to herein as receiving the signal from the headphone.

A microphone, such as the feedback microphone referred to by FIG. 1, typically generates an electrical signal by converting an acoustic signal, such as from a voice, to an electrical signal. A transducer, e.g., a moving coil transducer or an audio speaker, typically generates an acoustic signal by passing a modulating electrical signal through a speaker driver coil, which in turn moves the transducer to generate the acoustic signal. A transducer can also work in reverse, by generating an electrical signal in response to being perturbed by an external acoustic signal, for example.

The electrical signal generated by exposing the transducer to acoustic power may be referred to as back Electro-Motive Force, or back EMF. Certain implementations of the disclosed technology may take advantage of this by monitoring a signal generated by the transducer of a headphone, such as when the user places the headphone in or around his or her ear. In certain implementations, the transducer converts sensed pressure to an output signal.

Operation of the flow in the example 200 are generally similar to the operation of the flow in the example 100 of FIG. 1, except that the signal generated by the headphone, e.g., the transducer, is different than the signal generated by the feedback microphone. Specifically, operating the transducer in reverse is generally not as sensitive of a microphone as an actual feedback microphone, but this difference can be overcome by using slightly different steps to determine insertion detection. In the example 200, a signal is received by monitoring the back EMF of the headphone in a first operation 210. An optional second operation 220 includes filtering the back EMF signal, as the natural qualities of the back EMF generally lend themselves to easier detection than the signal from the feedback microphone.

In certain embodiments, a template matching operation 230 may performed. Such template matching may include determining whether the filtered signal remains above a threshold for a certain period of time. In a comparing operation 240, the filtered signal is compared to a signal level threshold. The threshold in operation 240 may be the same threshold or a different threshold that that used during operation 230.

An operation 250 determines whether the filtered signal has exceeded the threshold used in operation 240. If the determination is that the signal has exceeded the threshold, then the system creates an insertion detection signal as indicated by operation 260. Conversely, if the determination is that the signal did not exceed the threshold, then no insertion detection signal is generated as indicated by operation 270.

The operations illustrated by FIG. 2 may be used by a headphone while the headphone is operating in an ultra-low power mode, because the system uses less power in detecting the back EMF signal from the headphone speaker rather than being forced to power the feedback microphone, as was the case for the operations described with reference to FIG. 1.

Figure 3:
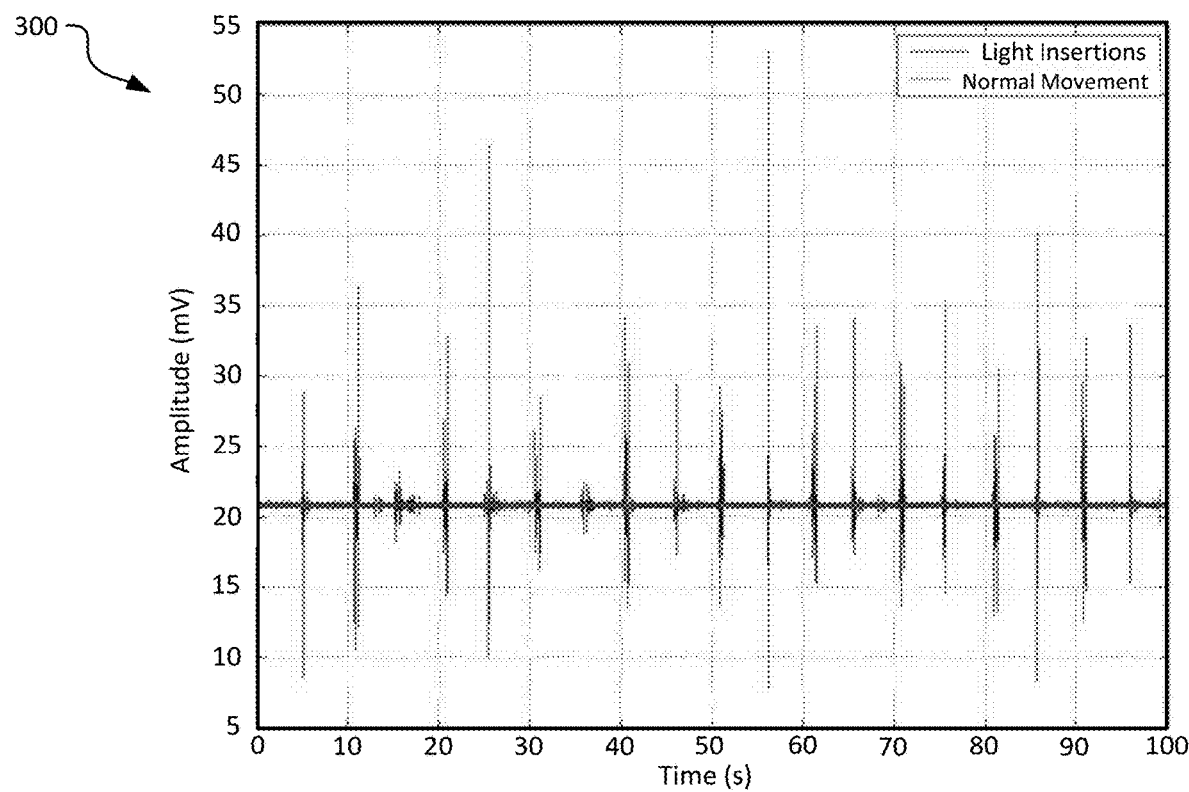
FIG. 3 is a graph illustrating exemplary changes in amplitude over time for a signal generated by back EMF of a headphone speaker in an earbud, i.e., an in-ear headphone.

FIG. 3 is a graph 300 illustrating exemplary changes in amplitude over time for a signal generated by back EMF of a headphone speaker in an earbud, i.e., an in-ear headphone. In the example 300, the insertion events have a significantly higher amplitude than that of the normal movements.

Figure 4:
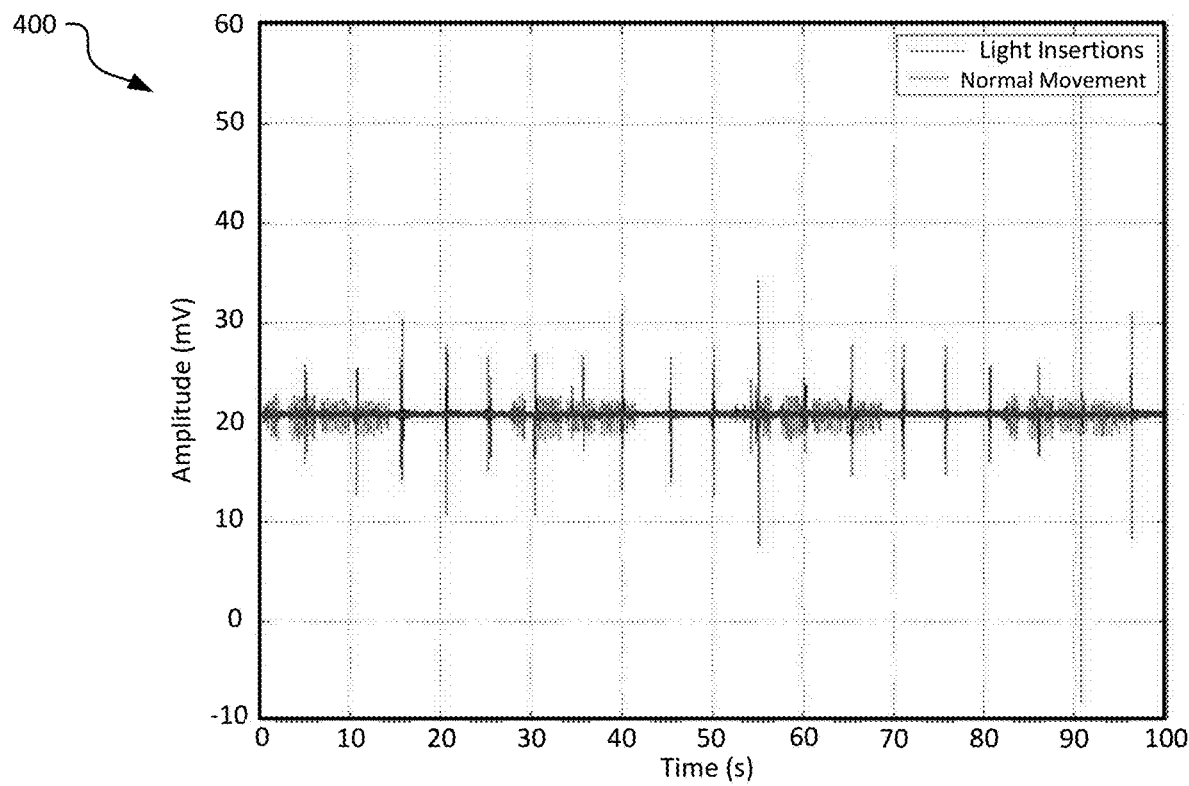
FIG. 4 is a graph illustrating exemplary changes in amplitude over time for a signal generated by a back EMF of a headphone speaker in an around-the-ear headphone.

FIG. 4 is a graph 400 illustrating exemplary changes in amplitude over time for a signal generated by a back EMF of a headphone speaker in an around-the-ear headphone. In the example 400, there is a clear difference between the amplitudes of the insertion events and the background noise, though not as pronounced as in the in-ear headphone example 300 illustrated by FIG. 3.

Figure 5:
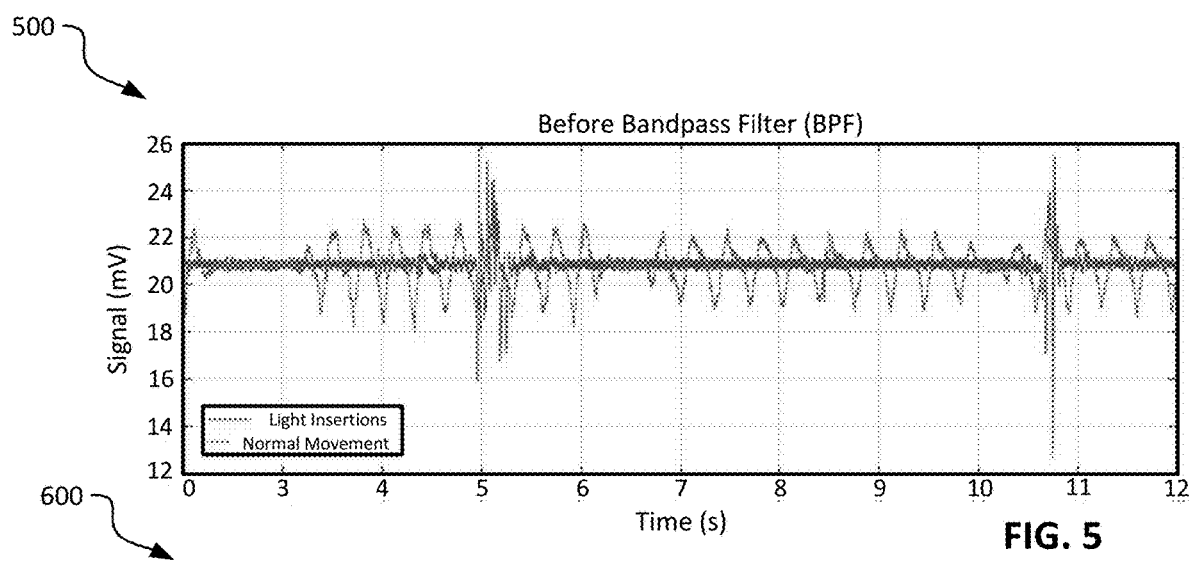
FIG. 5 is a graph illustrating a signal corresponding to insertion events and normal movements before passing through a conditioning filter, e.g., a bandpass filter.
Figure 6:
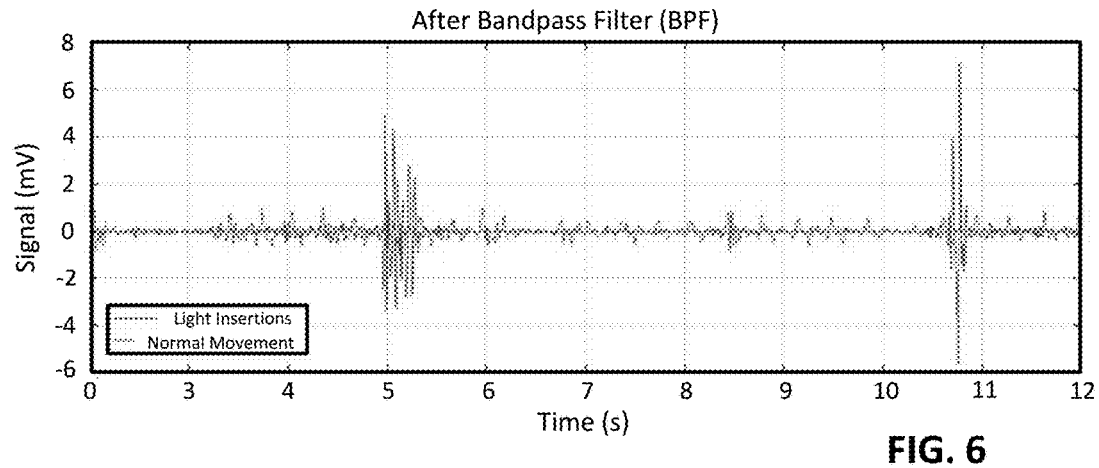
FIG. 6 is a graph illustrating the signal of FIG. 5 after passing through the conditioning filter.

FIG. 5 is a graph 500 illustrating a signal corresponding to insertion events and normal movements before passing through a conditioning filter, e.g., a bandpass filter, and FIG. 6 is a graph 600 illustrating the signal of FIG. 5 after being passed through the conditioning filter. In comparing the graphs 500 and 600, one can readily appreciate that the filtered signal makes it much easier to differentiate the insertion events from the background noise based on their increased signal to noise ratio.

Figure 7:
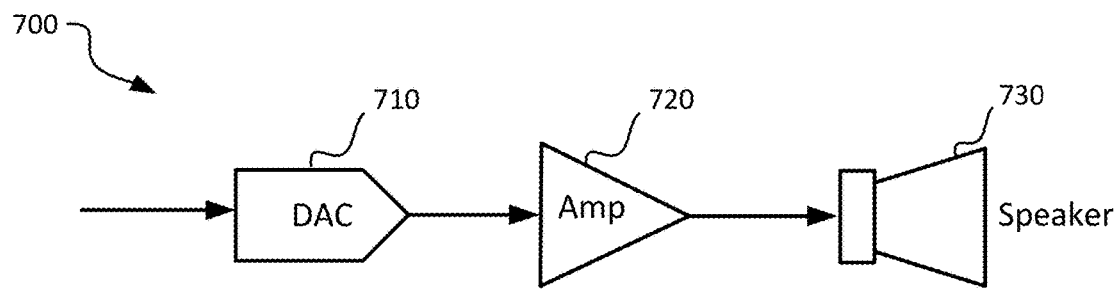
FIG. 7 is a schematic block diagram illustrating an example of how a typical speaker in a headphone is operationally connected.

FIG. 7 is a schematic block diagram illustrating an example 700 of how a typical transducer 730, e.g., a speaker or speaker driver, in a headphone is operationally connected. In the example 700, an analog signal is generated by a Digital to Analog Converter (DAC) 710. The analog signal is then amplified by a power amplifier 720 and passed to the transducer 730 to generate the intended sounds for the user.

Figure 8:
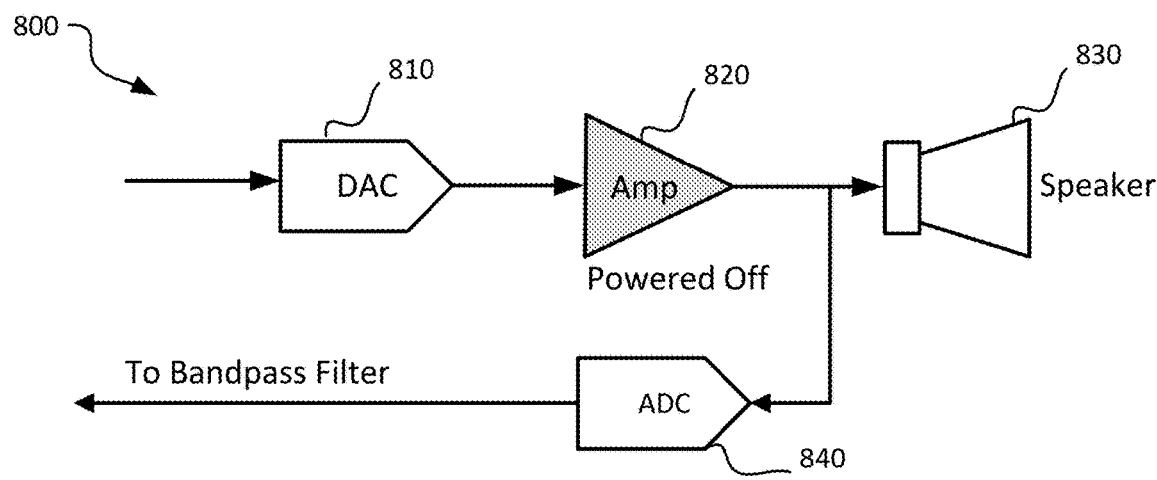
FIG. 8 is a schematic block diagram that illustrates an example of monitoring a speaker such as the speaker of FIG. 7 for back EMF to evaluate when an insertion has occurred.

FIG. 8 is a schematic block diagram that illustrates an example 800 of monitoring a transducer 830, e.g., a speaker or speaker driver, such as the transducer 730 of FIG. 7, for back EMF to evaluate when an insertion event has occurred. In this low-power mode, an amplifier 820, such as the amplifier 720 of FIG. 7, is powered down or completely powered off and the transducer 830 is coupled with an Analog to Digital Converter (ADC) 840 such that, when the transducer 830 is exposed to acoustic energy, the transducer 830 may generate an electrical signal that passes through the ADC and can be monitored. Optionally, the electrical signal may be passed through a conditioning filter such as a bandpass filter.

Figure 9:
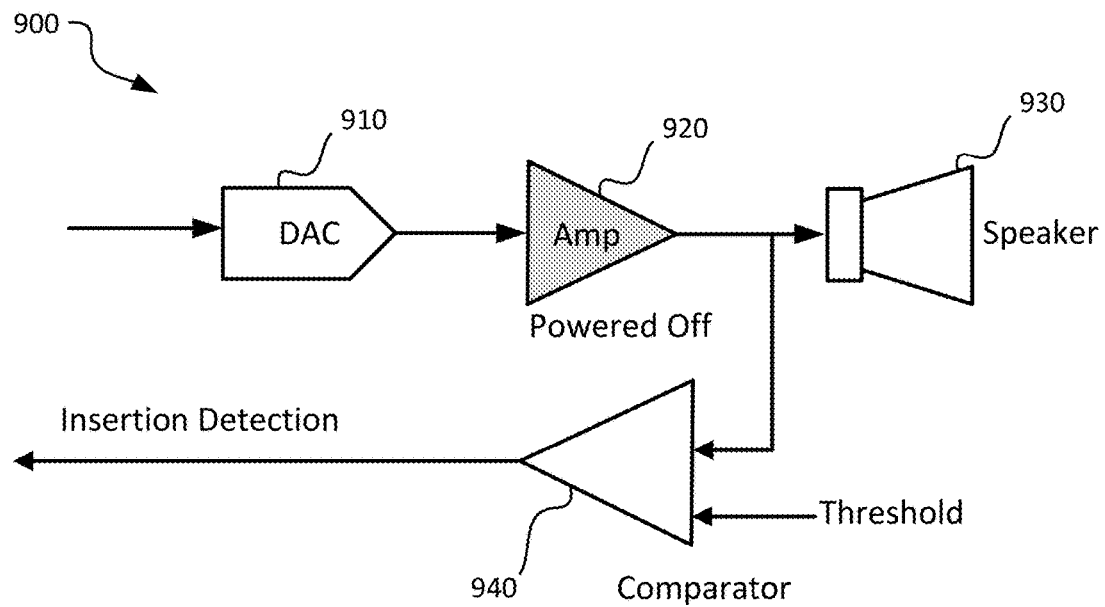
FIG. 9 is a schematic block diagram that illustrates an example of a pure analog mode of operation for monitoring a speaker such as the speaker of FIG. 7.

FIG. 9 is a schematic block diagram that illustrates an example 900 of a pure analog mode of operation for monitoring a transducer 930, such as the transducer 730 of FIG. 7. In this ultra-low power mode in which the amplifier 920 is powered down or off as well as the microphone (not shown), the back EMF signal is directly compared to an analog threshold signal through a comparator 940. When the comparator 940 indicates the back EMF is above the threshold, an insertion detection signal may be generated. Otherwise, no insertion detection signal occurs. Optionally, the signal from the comparator 940 may be passed through a conditioning filter such as a bandpass filter.

Figure 10:
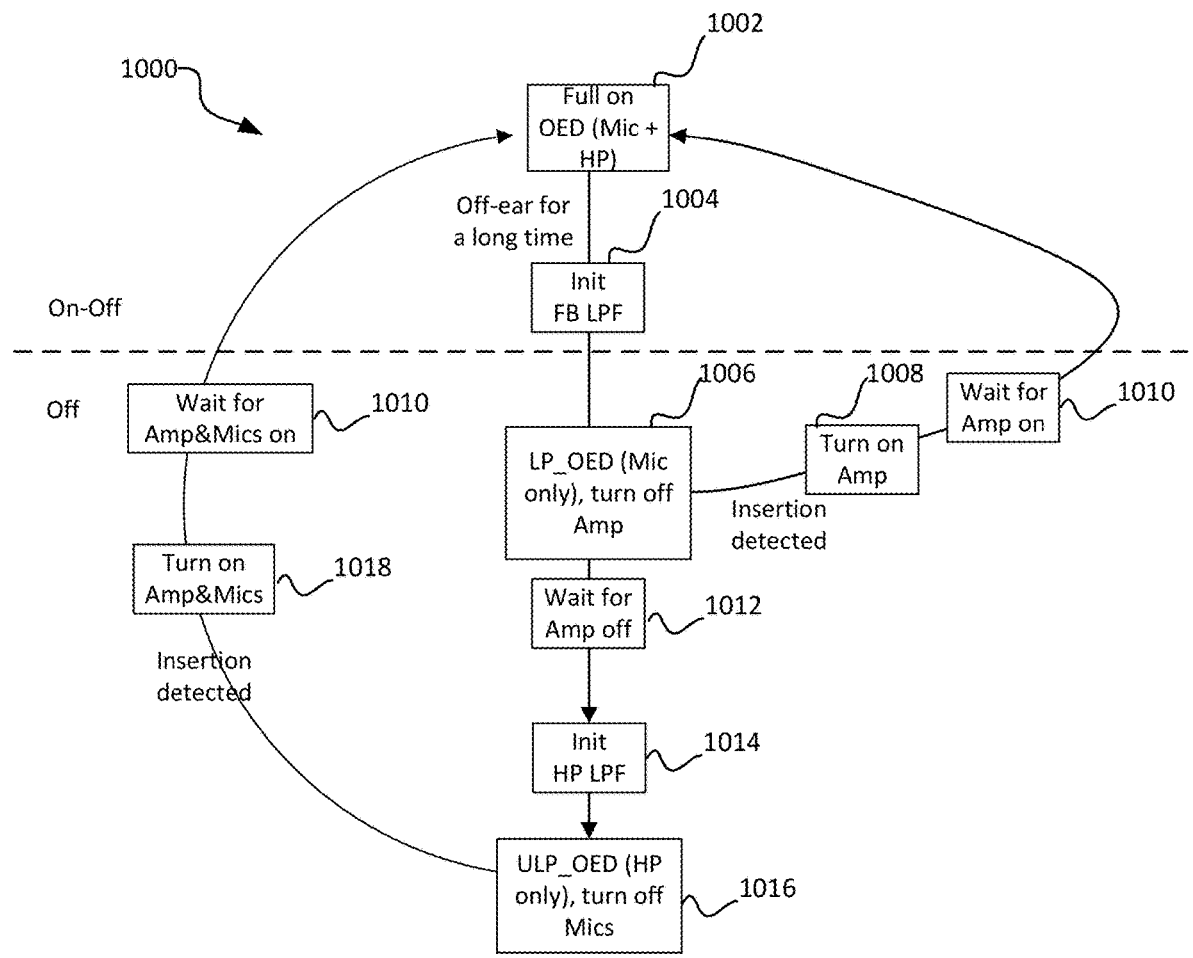
FIG. 10 is a flow diagram illustrating an example of operating a headphone in low power and ultra-low power modes during insertion detection in accordance with certain embodiments of the disclosed technology.

FIG. 10 is a flow diagram illustrating an example 1000 of operating a personal audio device, such as a headphone or earbud, for example, in regular power, low power, and ultra-low power modes during insertion detection in accordance with certain embodiments of the disclosed technology. At an initial operation 1002, the headphone is operating in a normal power mode, e.g., playing music for a user, and the off-ear detection (OED) is full on, meaning that a microphone and transducer, e.g., a speaker, are both being used for detecting a headphone insertion event. In an optional operation at 1004, either or both of the signals from the microphone and transducer are passed through a conditioning filter, such as a bandpass filter or a low-pass filter. Operation 1004 may be triggered the headphones have been removed for a certain period of time, e.g., between 1-20 seconds.

At operation 1006, the headphone enters a low-power mode by way of significantly reducing or completely removing the operating power of the amplifier, leaving only the microphone for performing the insertion detection. In certain implementations, the low power mode is accomplished by increasing the impedance of the power amplifier such that it exceeds the impedance of the transducer.

Responsive to the detection of an insertion event, power may be restored to the amplifier as indicated by operation 1008. Once the amplifier returns to normal power, as indicated by 1010, the headphone may return to full on OED, as indicated by 1002, and the headphone may resume playing music that had been previously paused after the headphone had been removed from the user's ear, for example.

After the operating power to the amplifier has been reduced at 1006 and a certain period of time has passed for the amplifier to be powered down, as indicated by 1012, the signal from the microphone may be optionally passed through a conditioning filter, such as a bandpass filter or low-pass filter, as indicated by 1014.

At operation 1016, the headphone enters an ultra-low power mode by way of significantly reducing or completely removing the operating power to the microphone, leaving only the transducer, without power from the amplifier, for performing the headphone insertion detection. Responsive to the detection of an insertion event, power may be restored to either or both the amplifier and the microphone as indicated by operation 1018. Once the amplifier returns to normal power, as indicated by 1010, the headphone may return to full on OED, as indicated by 1002, and the headphone may resume playing music that had been previously paused after the headphone had been removed from the user's ear, for example.

It will be appreciated that it is generally beneficial for the headphone to operate the insertion detection in the low power mode before moving directly to the ultra-low power mode because it takes relatively longer for the system to enter the ultra-low power mode. So, it is possible that an insertion event may be missed and therefore not detected while the system is changing from the regular operating mode to the ultra-low power mode. By changing to the low power mode before entering the ultra-power mode, such insertion events will not be missed because the system always has at least one insertion detection mode in operation. Operating in these modes is possible because it is possible for the system to operate in the low power mode and the ultra-low power mode simultaneously as well as to operate in the low power mode and the regular operating mode simultaneously.

If, however, no insertion is detected while in the low power mode, the system enters the ultra-low power mode by first turning off the driver amplifier. After the amplifier is turned off, the system begins monitoring the back EMF of the speaker of the headphone in the ultra low power mode as described above. When the system detects an insertion while in the ultra low power mode, both the microphones and amplifiers are turned on. After the microphones and amplifiers are turned on, the system returns to its initial ON state, and music again begins to play for the user.

Figure 11:
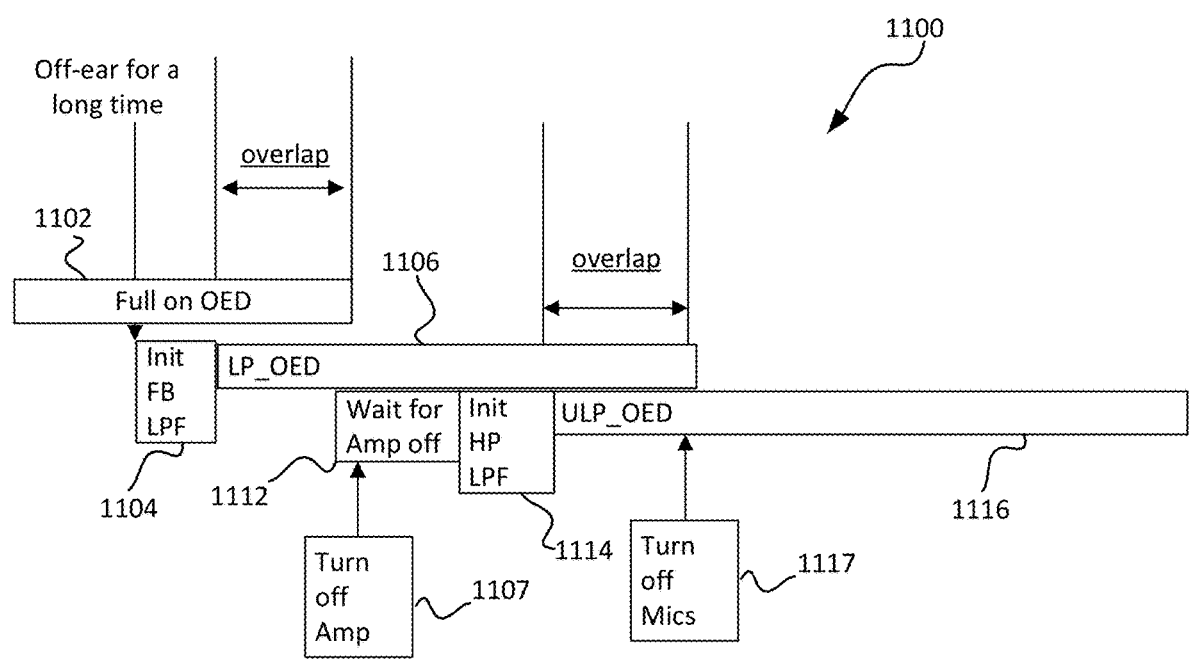
FIG. 11 is a timing diagram illustrating the example of FIG. 10 in which the low-power detection mode can overlap either or both the full on-ear detection mode and the ultra-low power insertion detection mode in accordance with certain embodiments of the disclosed technology.

FIG. 11 is a timing diagram 1100 illustrating the example 1000 of FIG. 10 in which the low-power detection mode of the personal audio device can overlap either or both the full off-ear detection mode and the ultra-low power insertion detection mode in accordance with certain embodiments of the disclosed technology.

An initial operation 1102, the personal audio device, such as a headphone or earbud, for example, is operating in a normal power mode, e.g., playing music for a user, and the off-ear detection (OED) is full on, meaning that a microphone and transducer, e.g., a speaker, are both being used for detecting a headphone insertion event. In an optional operation at 1104, either or both of the signals from the microphone and the transducer may be passed through a conditioning filter, such as a bandpass filter or a low-pass filter. Operation 1104 may be triggered the headphones have been removed from the user's ear for a certain period of time, e.g., between 1-20 seconds.

At operation 1106, the headphone enters a low-power mode by way of significantly reducing or completely removing the operating power of the amplifier for the transducer, as indicated by operation 1107, thus leaving only the microphone for performing the headphone insertion detection. In certain implementations, the low power mode may be accomplished by increasing the impedance of the power amplifier such that it exceeds the impedance of the transducer.

After the operating power to the amplifier has been reduced or removed at 1106 and a certain period of time has passed for the amplifier to be powered down, as indicated by 1112, the signal from the microphone may be optionally passed through a conditioning filter, such as a bandpass filter or low-pass filter, as indicated by 1114. In certain embodiments, waiting for the amplifier to power down at operation 1112 may include waiting for an impedance of the amplifier to go to a high impedance. The waiting period at 1112 may also include waiting for the conditioning filter to settle.

At operation 1116, the headphone enters an ultra-low power mode by way of significantly reducing or completely removing the operating power to the microphone, as indicated by operation 1117, leaving only the transducer, without power from the amplifier, for performing the headphone insertion detection.

It will be appreciated that, because the different insertion detection modes can operate simultaneously, the overall system can work in any operating power mode, and during any transition to any other operation power mode, without experiencing periods where the system is unable to detect headphone insertion events.

Figure 12:
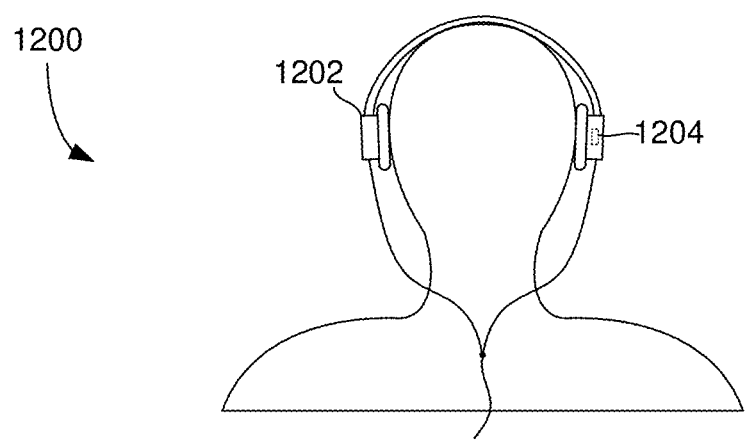
FIG. 12 illustrates an example of a headphone, which is depicted as being worn by the user, or on ear in accordance with certain embodiments of the disclosed technology.

FIG. 12 illustrates an example 1200 of a headphone 1202, which is depicted as being worn, or on ear, in accordance with certain embodiments of the disclosed technology. In the example, portions of or all of a headphone insertion detection system 1204 as described herein is integrated with the headphone 1202.

Figure 13:
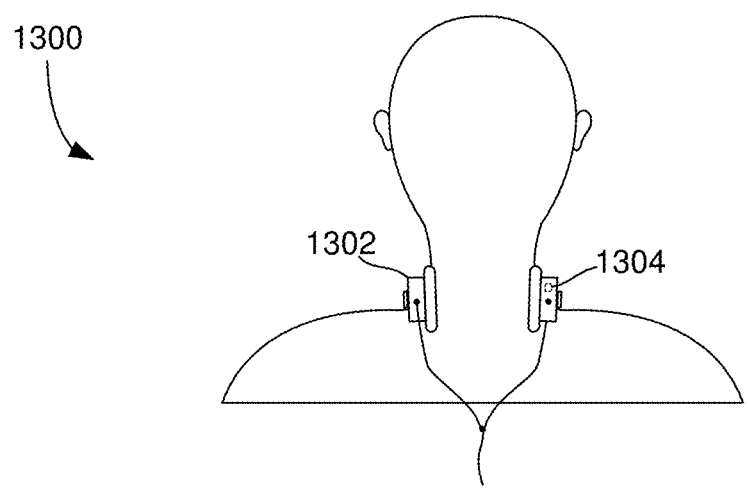
FIG. 13 illustrates an example of a headphone, such as the headphone of FIG. 12, which is depicted as being not worn by the user, or off ear in accordance with certain embodiments of the disclosed technology.

FIG. 13 illustrates an example 1300 of a headphone 1302, such as the headphone 1202 of FIG. 12, having integrated therewith a headphone insertion detection system 1304, such as the headphone insertion detection system 1204 of FIG. 12. In the example 1300, the headphone 1300 is depicted as being not worn, or off ear, in accordance with certain embodiments of the disclosed technology.

Figure 14:
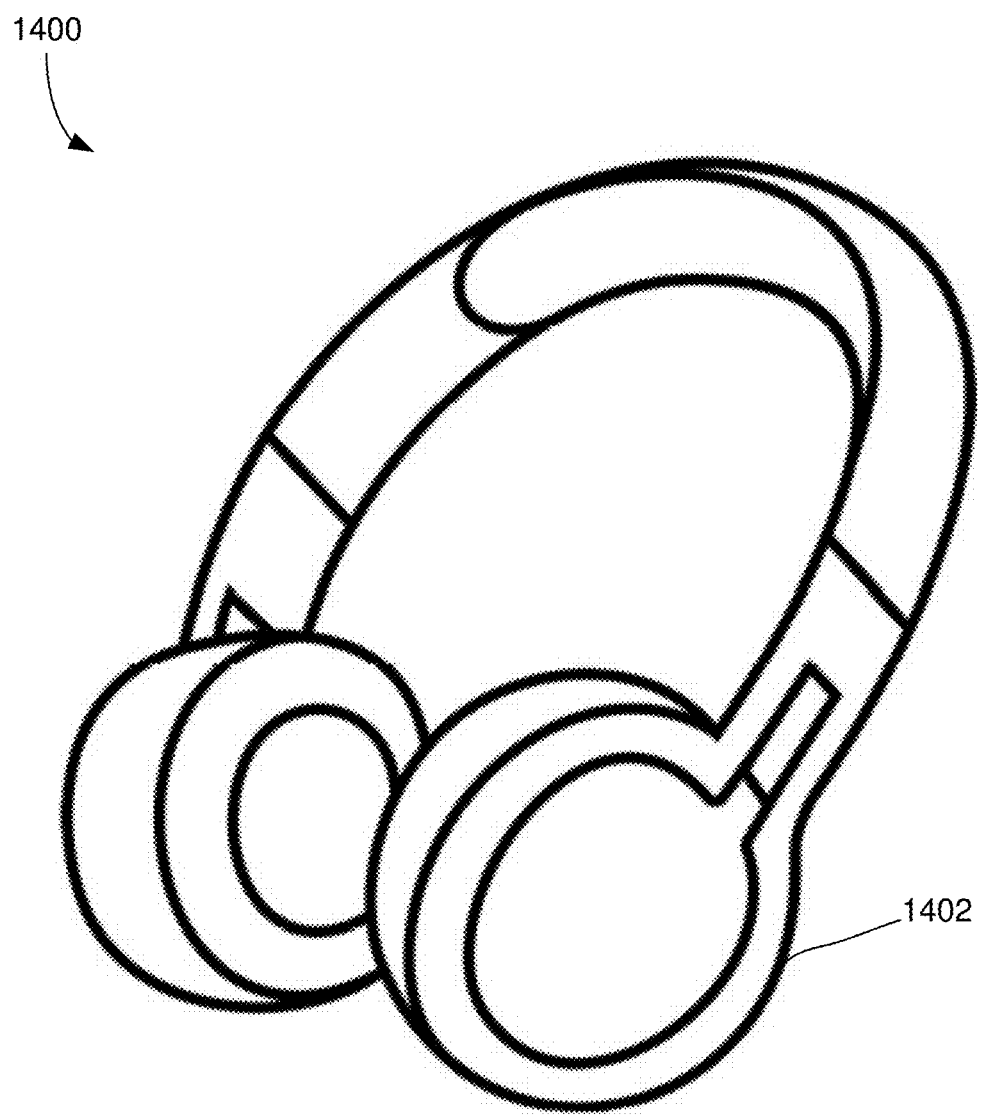
FIG. 14 is a perspective view illustrating an example of a headphone, such as the headphones of FIGS. 12 and 13, in accordance with certain embodiments of the disclosed technology.

FIG. 14 is a perspective view 1400 illustrating an example of a headphone 1402, such as the headphones 1202 and 1302 of FIGS. 12 and 13, respectively, in accordance with certain embodiments of the disclosed technology. It will be appreciated that, as used herein, the term headphone may be used to describe virtually any type of headphones that generally include one or more cup portions that each have a speaker or other suitable transducer configured to provide an audio output to a user.

A headphone as described herein is typically arranged to be worn such that each cup—and thus corresponding speaker—is on, around, or otherwise in close proximity to one of the user's ears, e.g., when the user desires to listen to music or other audio content. The headphone also generally includes a band or other mechanism configured to rest on top of or around the user's head so as to effectively maintain positioning of the speakers on, around, or otherwise in close proximity to the user's ears, e.g., so that the user may listen to music or other audio output provided from either one or both of the speakers. The headphone may be circumaural or supra-aural, for example. The headphone may be wired or wireless.

In certain implementations, a headphone can include a headphone insertion detection system, such as the headphone insertion detection system 1204 and 1304 of FIGS. 12 and 13, respectively. The detection system may include a microphone that is configured to convert an ambient sound wave to an electrical audio signal and one or more filters configured to receive the electrical audio signal from the microphone and produce a modified audio signal based on certain filter parameters.

The detection system may also include a transducer configured to convert a sensed pressure to a second electrical audio signal and a secondary filter configured to receive the electrical audio signal from the microphone and produce a modified audio signal based on certain filter parameters. The system may include a control circuit configured to determine whether either or both of the modified audio signals exceeds a respectively corresponding signal level threshold as described elsewhere herein.

Figure 15:
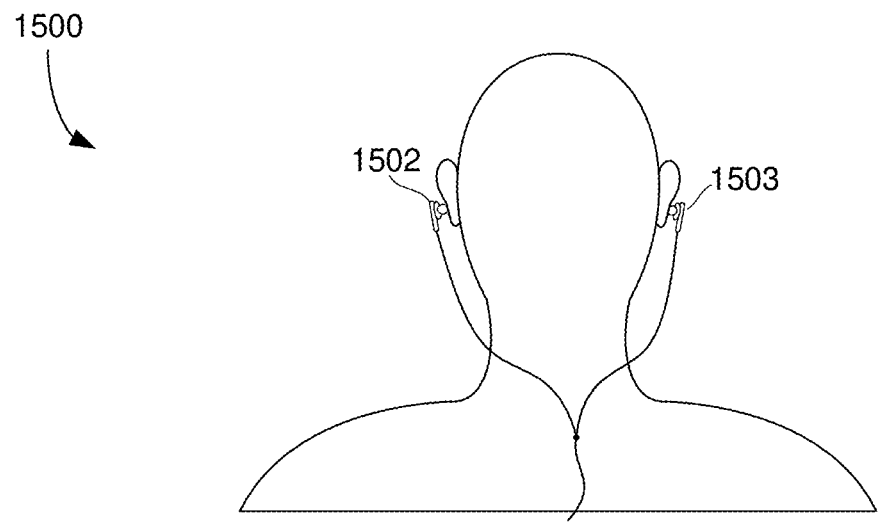
FIG. 15 illustrates an example of a pair of earbuds, which is depicted as being on ear in accordance with certain embodiments of the disclosed technology.

FIG. 15 illustrates an example 1500 of a pair of earbuds 1502 and 1503, which is depicted as being worn, or in ear in accordance with certain embodiments of the disclosed technology. In the example, portions of or all of an earbud insertion detection system as described herein is integrated with the earbuds 1502 and 1503.

Figure 16:
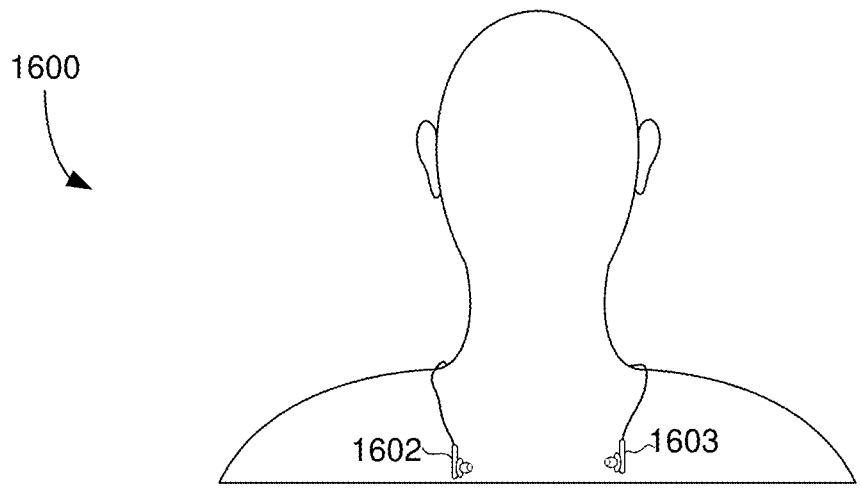
FIG. 16 illustrates an example of a pair of earbuds, such as the earbuds of FIG. 15, which is depicted as being off ear in accordance with certain embodiments of the disclosed technology.

FIG. 16 illustrates an example 1600 of a pair of earbuds 1602 and 1603, such as the earbuds 1502 and 1503 of FIG. 15, having integrated therewith an earbud insertion detection system. In the example 1600, the pair of earbuds 1602 and 1603 is depicted as being not worn, or out ear, in accordance with certain embodiments of the disclosed technology.

Figure 17:
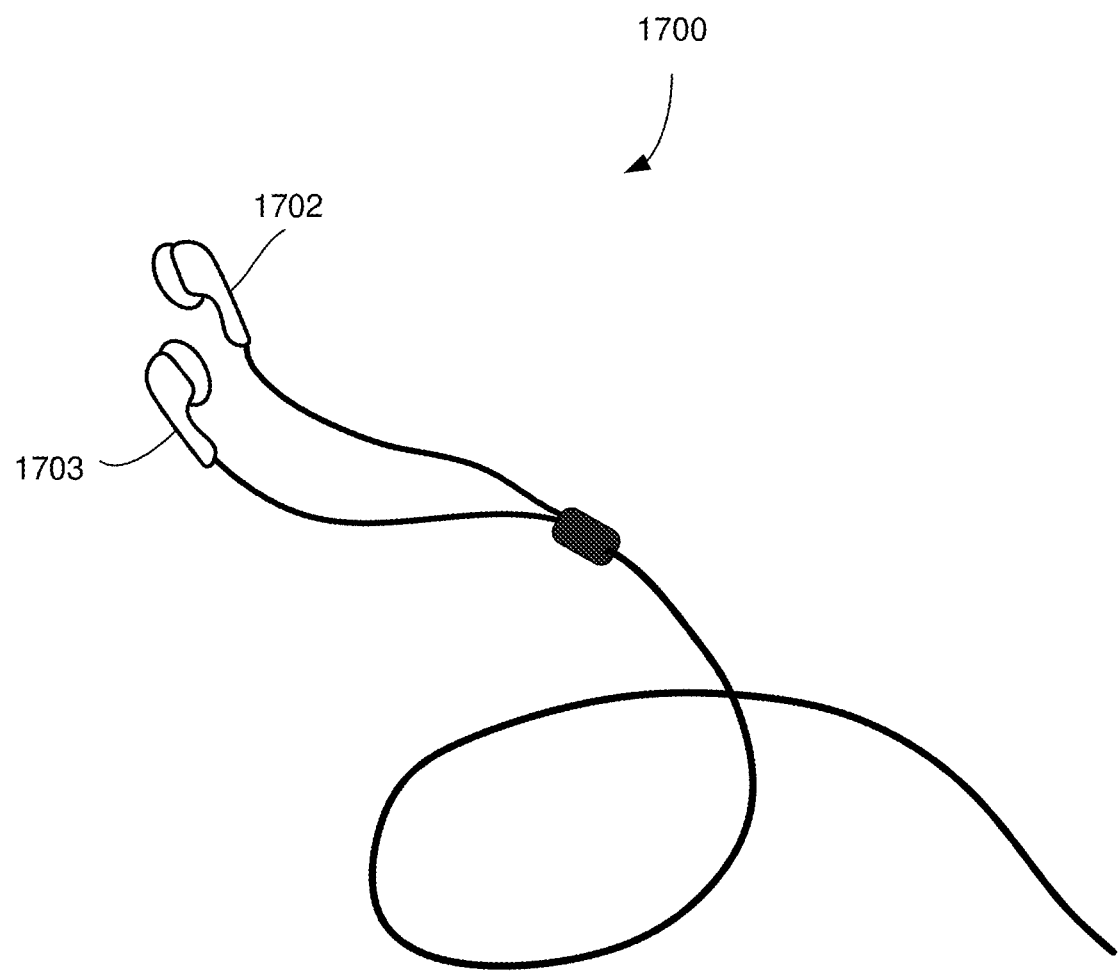
FIG. 17 is a perspective view illustrating an example of a pair of earbuds, such as the earbuds of FIGS. 15 and 16, in accordance with certain embodiments of the disclosed technology.

FIG. 17 is a perspective view 1700 illustrating an example of a pair of earbuds 1702 and 1703, such as the earbuds 1502-1503 and 1602-163 of FIGS. 15 and 16, respectively, in accordance with certain embodiments of the disclosed technology. It will be appreciated that, as used herein, the term earbud may be used to describe virtually any type of individual electronic device having a casing or other suitable portion that is configured to house or otherwise support a speaker or other suitable transducer integrated therewith and configured to provide an audio output to a user. The earbud is typically arranged to be worn in or in close proximity to a user's ear canal and may optionally be circumaural or supra-aural, for example. The earbud may be wired or wireless.

In certain implementations, an earbud as described herein can include an earbud insertion detection system. The detection system may include a microphone that is configured to convert an ambient sound wave to an electrical audio signal and one or more filters configured to receive the electrical audio signal from the microphone and produce a modified audio signal based on certain filter parameters.

The detection system may also include a transducer configured to convert a sensed pressure to a second electrical audio signal and a secondary filter configured to receive the electrical audio signal from the microphone and produce a modified audio signal based on certain filter parameters. The system may include a control circuit configured to determine whether either or both of the modified audio signals exceeds a respectively corresponding signal level threshold as described elsewhere herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this disclosure to mean that other components, features, steps, processes, operations, etc. are optionally present. For example, an article "comprising" or "which comprises" components A, B, and C can contain only components A, B, and C, or it can contain components A, B, and C along with one or more other components.

Also, directions such as "right" and "left" are used for convenience and in reference to the diagrams provided in figures. But the disclosed subject matter may have a number of orientations in actual use or in different implementations. Thus, a feature that is vertical, horizontal, to the right, or to the left in the figures may not have that same orientation or direction in all implementations.

EXAMPLES

Illustrative examples of the technologies disclosed herein are provided below. An embodiment of the technologies may include any one or more, and any combination of, the examples described below.

Example 1 includes a method for operating a personal audio device configured to be removed from and inserted into a user's ear, the method comprising: generating an input signal by each of a plurality of input signal generating devices of the personal audio device; determining whether an insertion event has occurred based on each generated input signal; causing the personal audio device to operate in a low power mode responsive to an absence of an insertion event determination after a first period of time; and causing the personal audio device to operate in an ultra-low power mode responsive to the absence of an insertion event determination after a second period of time that occurs after the first period of time, the ultra-low power mode having a lower power consumption that the low power mode.

The personal audio device of Example 1 may include a headphone or an earbud, for example.

Example 2 includes the method of Example 1, the method further comprising causing the personal audio device to operate in a regular power mode responsive to a determination that an insertion event has occurred.

Example 3 includes the method of any of Examples 1-2 wherein causing the personal audio device to operate in a low power mode includes reducing power to a power amplifier coupled with a first one of the plurality of input signal generating devices.

Example 4 includes the method of Example 3 wherein the first one of the plurality of input signal generating devices is a transducer.

Example 5 includes the method of Example 3 wherein causing the personal audio device to operate in an ultra-low power mode includes reducing power to a second one of the plurality of input signal generating devices.

Example 6 includes the method of Example 5 wherein the second one of the plurality of input signal generating devices is a microphone.

Example 7 includes the method of Example 4, the method further comprising triggering the second period of time once an impedance of the power amplifier exceeds an impedance of the transducer.

Example 8 includes the method of Example 4, the method further comprising the transducer converting a sensed pressure into the input signal generated by the transducer.

Example 9 includes the method of Example 6, the method further comprising the microphone converting an ambient sound wave into the input signal generated by the microphone.

Example 10 includes the method of any of Examples 1-9, the method further comprising filtering each input signal.

Example 11 includes an insertion detection system for detecting insertion of a personal audio device into a user's ear comprising: a microphone configured to convert an ambient sound wave to a first electrical audio signal; a first filter configured to receive the first electrical audio signal from the microphone and produce a first modified audio signal based on first filter parameters; a transducer configured to convert a sensed pressure to a second electrical audio signal; a second filter configured to receive the second electrical audio signal from the microphone and produce a second modified audio signal based on second filter parameters; and a control circuit configured to determine whether either or both of the first and second modified audio signals exceeds a respectively corresponding signal level threshold.

The personal audio device of Example 11 may include a headphone or an earbud, for example.

Example 12 includes the system of Example 11 wherein each of the first and second filters is a bandpass filter or a low frequency filter.

Example 13 includes the system of any of Examples 11-12 wherein the control circuit is further configured to generate an insertion detection signal responsive to a determination that either or both of the first and second modified audio signals exceeds the respectively corresponding signal level threshold.

Example 14 includes the system of Example 13 further comprising a speaker configured to, responsive to the generated insertion detection signal, resume playing an audio output that had been paused responsive to a removal of the headphone from the user's ear.

Example 15 includes the system of any of Examples 11-14 further comprising an amplifier coupled with the transducer and configured to be powered down responsive to neither of the first and second modified audio signals exceeding the respectively corresponding signal level threshold after a first period of time.

Example 16 includes the system of Example 15 wherein the microphone is further configured to be powered down responsive to neither of the first and second modified audio signals exceeding the respectively corresponding signal level threshold after a second period of time that occurs after the first period of time.

Example 17 includes a system for detecting insertion of a personal audio device into a user's ear comprising: a speaker driver configured to generate an input signal based on a sensed pressure; and a control component configured to determine whether the input signal exceeds a signal level threshold and create an insertion detection signal responsive to a determination that the input signal exceeds the signal level threshold.

The personal audio device of Example 17 may include a headphone or an earbud, for example.

Example 18 includes the system of Example 17 wherein the control component includes a conditioning filter mechanism configured to filter the input signal before determining whether the input signal exceeds the signal level threshold.

Example 19 includes the system of any of Examples 17-18 wherein the control component includes a comparator configured to compare the input signal to the signal level threshold.

Example 20 includes the system of any of Examples 17-19 further comprising an amplifier coupled with the transducer and configured to be powered down after a removal of the headphone from the user's ear.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Although specific embodiments of the invention have been illustrated and described for purposes of illustration, it will be understood that various modifications may be made without departing from the spirit and scope of the invention. Accordingly, the invention should not be limited except as by the appended claims.

The invention claimed is:

1. A method for operating a personal audio device configured to be removed from and inserted into a user's ear, the method comprising:
    generating an input signal by each of a plurality of input signal generating devices of the personal audio device;
    determining whether an insertion event has occurred based on each generated input signal;
    causing the personal audio device to operate in a low power mode responsive to an absence of an insertion event determination after a first period of time; and
    causing the personal audio device to operate in an ultra-low power mode responsive to the absence of an insertion event determination after a second period of time that occurs after the first period of time, the ultra-low power mode having a lower power consumption than the low power mode.

2. The method of claim 1 further comprising causing the personal audio device to operate in a regular power mode responsive to a determination that an insertion event has occurred.

3. The method of claim 1 wherein causing the personal audio device to operate in a low power mode includes reducing operating power to a power amplifier coupled with a first one of the plurality of input signal generating devices.

4. The method of claim 3 wherein the first one of the plurality of input signal generating devices is a transducer.

5. The method of claim 3 wherein causing the personal audio device to operate in the ultralow power mode includes reducing operating power to a second one of the plurality of input signal generating devices.

6. The method of claim 5 wherein the second one of the plurality of input signal generating devices is a microphone.

7. The method of claim 4 further comprising triggering the second period of time once an impedance of the power amplifier exceeds an impedance of the transducer.

8. The method of claim 4 further comprising the transducer converting a sensed pressure into the input signal generated by the transducer.

9. The method of claim 6 further comprising the microphone converting an ambient sound wave into the input signal generated by the microphone.

10. The method of claim 1 further comprising filtering each input signal.

11. A personal audio device insertion detection system for detecting insertion of a personal audio device into a user's ear, comprising:
    a microphone configured to convert an ambient sound wave to a first electrical audio signal during operation of the system in a low power mode;
    a first filter configured to receive the first electrical audio signal from the microphone and produce a first modified audio signal based on first filter parameters during operation of the system in the low power mode;
    a transducer configured to convert a sensed pressure to a second electrical audio signal;
    a second filter configured to receive the second electrical audio signal from the transducer and produce a second modified audio signal based on second filter parameters during operation of the system in an ultra-low power mode; and
    a control circuit configured to determine whether either of the first and second modified audio signals exceeds a respectively corresponding signal level threshold and to generate an insertion detection signal responsive to either of the first and second modified audio signals exceeding the respectively corresponding signal level.

12. The personal audio device insertion detection system of claim 11 wherein each of the first and second filters is a bandpass filter or a low frequency filter.

13. The personal audio device insertion detection system of claim 11 further comprising a speaker configured to, responsive to the generated insertion detection signal, resume playing an audio output that had been paused responsive to a removal of the personal audio device from the user's ear.

14. The personal audio device insertion detection system of claim 11 further comprising an amplifier coupled with the transducer and configured to be powered down responsive to neither of the first and second modified audio signals exceeding the respectively corresponding signal level threshold after a first period of time.

15. The personal audio device insertion detection system of claim 14 wherein the microphone is further configured to be powered down responsive to neither of the first and second modified audio signals exceeding the respectively corresponding signal level threshold after a second period of time that occurs after the first period of time.

16. A system for detecting insertion of a personal audio device into a user's ear, comprising:
    a speaker driver configured to generate an input signal based on a sensed pressure during operation of the system in an ultra-low power mode;
    a first filter configured to receive the input signal from the speaker driver and produce a first modified audio signal based on first filter parameters during operation of the system in the ultra-low power mode;
    a microphone configured to generate a second input signal based on a sensed pressure during operation of the system in a low power mode;
    a second filter configured to receive the second signal from the microphone and produce a second modified audio signal based on second filter parameters during operation of the system in the low power mode; and a control component configured to create an insertion detection signal responsive to either of the first and second modified audio signals exceeding a respectively corresponding signal level threshold.

17. The system of claim 16 wherein the control component includes a comparator configured to compare the input signal to the signal level threshold.

18. The system of claim 16 further comprising a power amplifier coupled with and configured to provide power to the transducer and be powered down after a removal of the personal audio device from the user's ear.

* * * * *